United States Patent
Singh et al.

(10) Patent No.: US 7,737,780 B2
(45) Date of Patent: Jun. 15, 2010

(54) SCHEME FOR IMPROVING SETTLING BEHAVIOR OF GAIN BOOSTED FULLY DIFFERENTIAL OPERATIONAL AMPLIFIER

(75) Inventors: Pratap N Singh, Benares (IN); Chandrajit Debnath, Greater Noida (IN); Rakesh Malik, Noida (IN); Arnold James D'Souza, Indore (IN)

(73) Assignee: STMicroelectronics PVT. Ltd., Greater Noida, Uttar Pradesh (IN)

( * ) Notice: Subject to any disclaimer, the term of this patent is extended or adjusted under 35 U.S.C. 154(b) by 0 days.

(21) Appl. No.: 11/900,917

(22) Filed: Sep. 12, 2007

(65) Prior Publication Data

US 2008/0074190 A1 Mar. 27, 2008

(30) Foreign Application Priority Data

Sep. 13, 2006 (IN) .................. 2024/DEL/2006

(51) Int. Cl.
*H03F 3/45* (2006.01)
(52) U.S. Cl. ....................... 330/253; 330/310
(58) Field of Classification Search ............ 330/260, 330/253, 261
See application file for complete search history.

(56) References Cited

U.S. PATENT DOCUMENTS

| | | | |
|---|---|---|---|
| 4,573,020 A | | 2/1986 | Whatley |
| 5,039,954 A | * | 8/1991 | Bult et al. ............ 330/277 |
| 5,748,040 A | * | 5/1998 | Leung ................. 330/253 |
| 5,764,101 A | | 6/1998 | Archer |
| 6,114,907 A | * | 9/2000 | Sakurai ................ 330/253 |
| 6,177,838 B1 | * | 1/2001 | Chiu ................... 330/253 |
| 6,353,361 B1 | * | 3/2002 | Sun .................... 330/253 |
| 6,362,688 B1 | * | 3/2002 | Au ..................... 330/261 |
| 6,411,165 B1 | | 6/2002 | Delano |
| 6,529,070 B1 | | 3/2003 | Nagaraj |
| 6,985,038 B2 | | 1/2006 | Miwa et al. |

OTHER PUBLICATIONS

Bult, K., Geelen, G., "A fast-settling CMOS operational amplifier for SC circuits with 90-db dc gain," IEEE Journal of Solid State Circuits, Dec. 1990, pp. 1379-1394, vol. 25, No. 6.
Gray, Paul. R., et al., "Neutralization", Analysis and Design of Analog Integrated Circuits, Feb. 14, 2001, pp. 849-850, 4th Ed.
Ahmadi, M. M., "A New Modeling and Optimization of Gain-Boosting Amplifier for High-Speed and Low-Voltage Applications", IEEE Transaction on Circuits and Systems II, Mar. 2006, pp. 169-173, vol. 53, Issue 3.
Siliconix AN105, "FETs as Voltage-Controlled Resistors," Mar. 10, 1997, pp. 1-6.

* cited by examiner

*Primary Examiner*—Robert Pascal
*Assistant Examiner*—Hieu P Nguyen
(74) *Attorney, Agent, or Firm*—Lisa K. Jorgenson; Paul F. Rusyn; Graybeal Jackson LLP

(57) ABSTRACT

Embodiments of the present invention disclose operational amplifiers which demonstrate good settling behavior with minimum over-shoot or ringing for improving settling behavior. The amplifiers include one or more amplification stages connected to form a symmetric structure. The amplification stage includes a boosting amplifier, a MOS transistor and a compensation capacitor. The MOS transistor can be an NMOS transistor and a PMOS transistor. Using this scheme pole-zero doublets are rearranged in a manner to improve the transient settling response.

12 Claims, 7 Drawing Sheets

SCHEME FOR IMPROVING SETTLING BEHAVIOR OF GAIN BOOSTED FULLY DIFFERENTIAL OPERATIONAL AMPLIFIER

PRIORITY CLAIM

The present application claims the benefit of Indian Patent Application Serial No. 2024/Del/2006, filed Sep. 12, 2006, published Sep. 12, 2008, which application is incorporated herein by reference in its entirety.

TECHNICAL FIELD

Embodiments of the present invention relate to operational amplifiers and more specifically to gain-boosted operational amplifiers for reducing the settling time and overshoot during the transient response owing to the presence of pole-zero doublets in the amplifier transfer function.

BACKGROUND

Speed and accuracy are the two major requirements of analog electronic circuits. Circuit optimization is again in great demand because in general optimization results in contradictory conditions. The speed and accuracy are determined by the settling behavior of the operational amplifier (Op-Amp); fast settling requires high unity gain frequency and accuracy requires a high DC gain. Need to raise the unity gain frequency leads to design of single stage amplifiers with short channel MOS transistors and high bias currents and in contradiction to this high gain requirement leads to multi stage amplifiers with large channel transistors and low bias currents.

A gain boosted technique proposed in "A fast-settling CMOS operational amplifier for SC circuits with 90-db dc gain" by K. Bult and G. Geelen, IEEE Journal of Solid State Circuits, vol. 25, pp. 1379-1394, December 1990, has enabled circuit designers to exploit the advantages of single-stage amplifiers with adequate gain. But with this technique pole-zero doublets are added in the transfer function of the op-amp which does not noticeably affect the frequency response of the amplifier but which introduces a very slow settling component in the settling response which can adversely affect the accuracy of the whole device.

Therefore, there is a need for an operational amplifier for reducing the settling times and overshooting during the transient response.

SUMMARY

Embodiments of the present invention provide operational amplifiers exhibiting excellent settling behavior with minimum over-shoot or ringing.

According to one embodiment of the present invention an operational amplifier for improving settling behavior which includes:
a first amplification stage connected to a first input port (INP) and a second input port (INM), a second amplification stage operatively coupled to said first amplification stage comprising:
a third amplification stage operatively coupled to said first amplification stage and said second amplification stage comprising:
a fourth amplification stage operatively coupled to said second amplification stage comprising:
a fifth amplification stage operatively coupled to said third amplification module and said fourth amplification stage comprising:
a sixth amplification stage operatively coupled to said fourth and fifth amplification stage.

According to one embodiment of the present invention, the first amplification stage includes:
a first transistor connected to said first input port;
a second transistor operatively coupled to said first transistor connected to said second input port; and
a third transistor having its drain connected to source terminals of said first transistor, and said second transistor, a gate terminal connected to a third input port, its source terminal connected to a ground voltage.

According to one embodiment of the present invention, the second amplification stage includes:
a first gain boosting module receiving a bias voltage at one of an input terminals;
a fourth transistor having a gate terminal connected to an output of said first gain boosting module, a source terminal connected to a second input of said first gain boosting module, and a drain terminal connected to a first output terminal;
a first compensation module operatively coupled to said fourth transistor and said first gain boosting module, said capacitor being connected to a node.

According to one embodiment of the present invention, the third amplification stage includes:
a second gain boosting module receiving a bias voltage at one of an input terminals;
a fifth transistor having a gate terminal connected to an output of said second gain boosting module, a source terminal connected to a second input of said second gain boosting module, and a drain terminal connected to a second output terminal;
a second compensation module having a first terminal coupled to said fifth transistor and said second gain boosting module, and having a second terminal connected to said fourth transistor of said second amplification stage.

According to one embodiment of the present invention, the fourth amplification stage includes:
a third gain boosting module receiving a bias voltage at one of an input terminal;
a sixth transistor having a gate terminal connected to an output of said third gain boosting module, a source terminal connected to a second input of said third gain boosting module, and a drain terminal connected to said first output terminal;
third compensation module having a first terminal coupled to said sixth transistor and said third gain boosting module, and having a second terminal connected to a node.

According to one embodiment of the present invention, the fifth amplification stage includes:
a fourth gain boosting module receiving a bias voltage at one of an input terminal;
a seventh transistor having a gate terminal connected to an output of said fourth gain boosting module, a source terminal connected to a second input of said fourth gain boosting module, and a drain terminal connected to said second output terminal;
a fourth compensation module having a first terminal coupled to said seventh transistor and said fourth gain boosting module, and having a second terminal connected to said sixth transistor of said fourth amplification stage.

According to one embodiment of the present invention, the sixth amplification stage includes:
- an eighth transistor having its source terminal connected to a supply terminal, and its drain terminal connected to said fourth amplification stage; and
- a ninth transistor having its gate connected to a gate terminal of said eighth transistor for receiving a bias voltage, having its source terminal connected to said supply terminal, and its drain terminal connected to said fifth amplification stage.

In one embodiment, the transistors comprise a NMOS transistor and a PMOS transistor.

In one embodiment, the compensation module comprises a capacitor.

In one embodiment, the boosting module and compensation module are substantially matched.

According to one embodiment of the present invention an operational amplifier for improving settling behavior includes:
- a first amplification stage connected to a first input port and a second input port including:
  - a first transistor connected to the first input port;
  - a second transistor connected to the second input port; and
  - a third transistor having a drain connected to source terminals of said first transistor and said second transistor, a gate terminal connected to a third input port, and a source terminal connected to a ground voltage;
- a second amplification stage operatively coupled to the first amplification stage comprising:
  - a first gain boosting stage receiving a first signal and a second signal;
  - a fourth transistor having a gate terminal connected to the first gain boosting stage, a source terminal connected to said first transistor, and a drain terminal connected to a first output port;
  - a fifth transistor having a gate terminal connected to the first gain boosting stage, a source terminal connected to said second transistor, and a drain terminal connected to a second output port;
    - a first capacitor and a second capacitor operatively coupled with the first gain boosting stage;
- a third amplification stage operatively coupled to the second amplification stage comprising:
  - a second gain boosting stage receiving a third signal and a fourth signal;
  - a sixth transistor having a gate terminal connected to the second gain boosting stage, a drain terminal connected to said fourth transistor through the first output port, and a source terminal connected to an input terminal of the second gain boosting stage;
  - a seventh transistor having a gate terminal connected to the second gain boosting stage, a drain terminal connected to said fifth transistor through the second output port, and a source terminal connected to the second gain boosting stage;
    - a third capacitor and a fourth capacitor operatively coupled to the second gain boosting stage;
- a fourth amplification stage operatively coupled to the third amplification stage comprising:
  - an eighth transistor having a source terminal connected to a supply terminal, and a drain terminal connected to said third amplification stage; and
  - a ninth transistor having a gate connected to a gate terminal of said eighth transistor for receiving a bias voltage, a source terminal connected to said supply terminal, and a drain terminal connected to said third amplification stage.

In one embodiment, the transistors comprise NMOS transistors and PMOS transistors.

An embodiment of the present invention further provides a method of providing an improved settling behavior through an operational amplifier including:
- providing a first amplification stage including a first transistor having a gate coupled to receive a first input signal, a second transistor having a gate coupled to receive a second input signal, and a third transistor coupled to sources of the first and second transistors for receiving a first supply voltage;
- providing a second amplification stage including a first gain boosting module receiving a bias voltage at one of an input terminals, a fourth transistor having a gate coupled to an output of said boost module, a source terminal connected to a second input of said gain boosting module, and a drain terminal connected to a first output terminal, a first compensation module operatively coupled to said fourth transistor and said gain boosting module;
- providing a third amplification stage including a second gain boosting module receiving the bias voltage at one of an input terminals, a fifth transistor having a gate coupled to an output of said boosting module, a source terminal connected to a second input of said gain boosting module, and a drain terminal connected to a second output terminal, a second compensation module operatively coupled to said fourth transistor and said second gain boosting module;
- providing a fourth amplification stage including a third gain boosting module receiving a bias voltage at one of an input terminals, a sixth transistor having a gate coupled to an output of said third boosting module, a source terminal connected to a second input of said third gain boosting module, and a drain terminal connected to the first output terminal, a third compensation module operatively coupled to said sixth transistor and said third gain boosting module;
- providing a fifth amplification stage including a fourth gain boosting module receiving a bias voltage at one of an input terminals, a seventh transistor having a gate coupled to an output of said fourth boosting module, a source terminal connected to a second input of said fourth gain boosting module, and a drain terminal connected to the second output terminal, a fourth compensation module operatively coupled to said sixth transistor and said fourth gain boosting module; and
- providing a sixth amplification stage operatively coupled to said fourth and fifth amplification stage including an eighth transistor having its source terminal connected to a supply terminal, and its drain terminal connected to said fourth amplification stage and a ninth transistor having its gate connected to a gate terminal of said eight transistor for receiving a bias voltage, having its source terminal connected to said supply terminal, and its drain terminal connected to said fifth amplification stage.

BRIEF DESCRIPTION OF THE DRAWINGS

The aforementioned aspects and other features of the present invention will be explained in the following description, taken in conjunction with the accompanying drawings, wherein.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
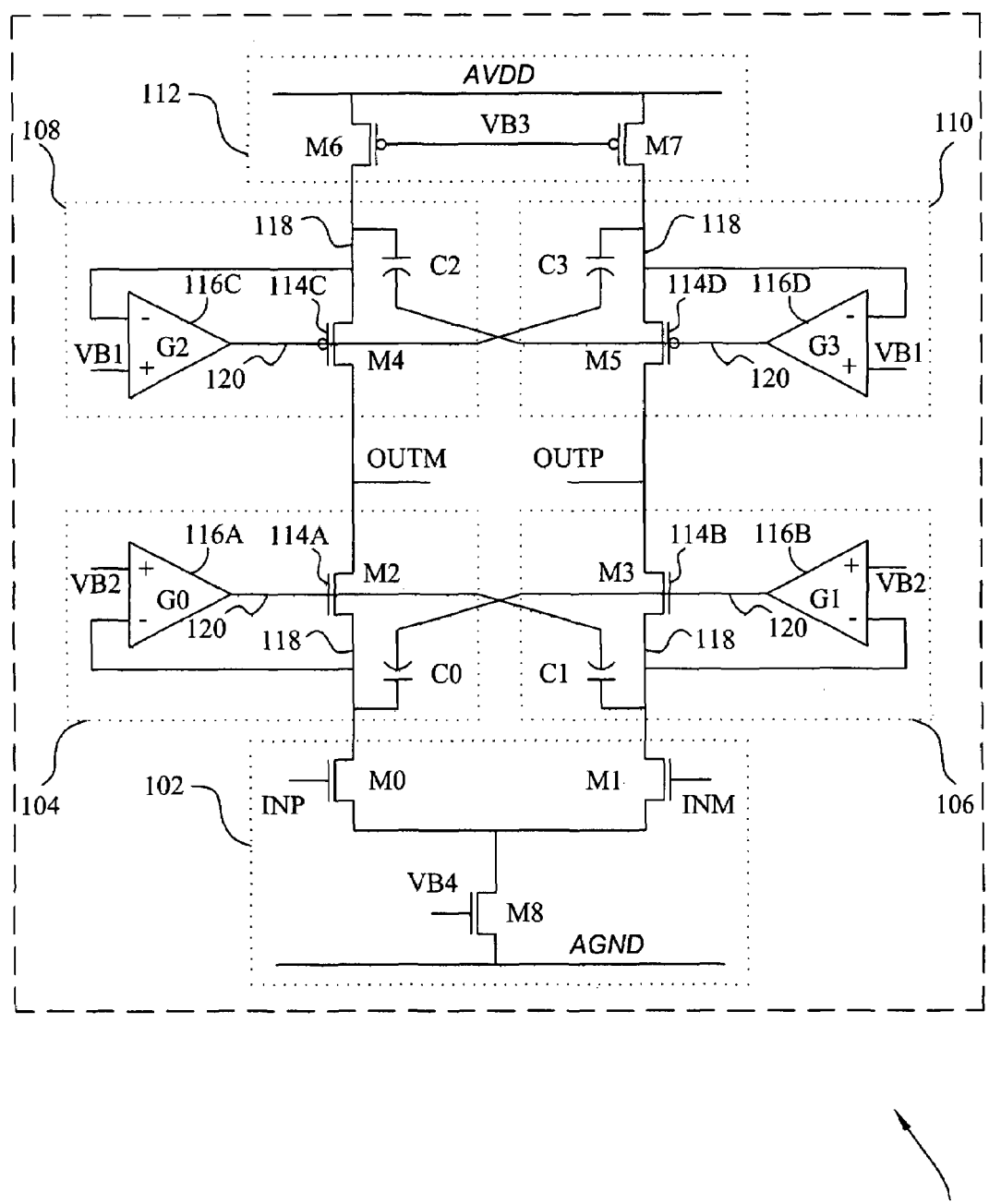
FIG. 1 illustrates a schematic diagram of a fully-differential gain-boosting technique according to an embodiment of the present invention.

FIG. 1 illustrates a schematic diagram of a fully-differential gain-boosting technique according to one embodiment of the present invention. In particular, the operational amplifier 100, has a first input terminal INP and a second input terminal INM and a first output terminal OUTP and a second output terminal OUTM respectively connected through a first, second, third, fourth, fifth, sixth amplification branches 102, 104, 106, 108, 110, and 112 respectively and these are connected to each other so as to form a symmetrical circuit.

In detail first amplification branch 102 includes one input NMOS transistor pair M0, M1 with gate terminals connected to input ports INP, INM respectively and having source terminals connected together with a drain terminal of another NMOS transistor M8 whose gate terminal is connected to an input port VB4 and having a source terminal connected to a second supply terminal AGND.

The amplification branches 104-112 include transistors such as 114A, 114B, 114C, 114D. The transistors 114A, 114B, 114C, 114D having their gate terminal connected to an output terminal of gain boosting stages such as 116A, 116B, 116C, 116D, and their source terminal connected to one input of the gain boosting stage (116A, 116B, 116C, 116D). The other inputs of the gain boosting stages (such as 116A, 116B, 116C, 116D) are connected to a fixed bias voltage VB1, VB2. Compensation capacitors, such as C0, C1, C2, C3 having one terminal connected to a source terminal of the transistors 114A, 114B, 114C, 114D and to an input of the gain boosting stage 116A, 116B, 116C, 116D and having other terminal connected to a gate terminal of a symmetrically opposite branch's transistor (such as transistor 114B which is opposite to transistor 114A).

Figure 2:
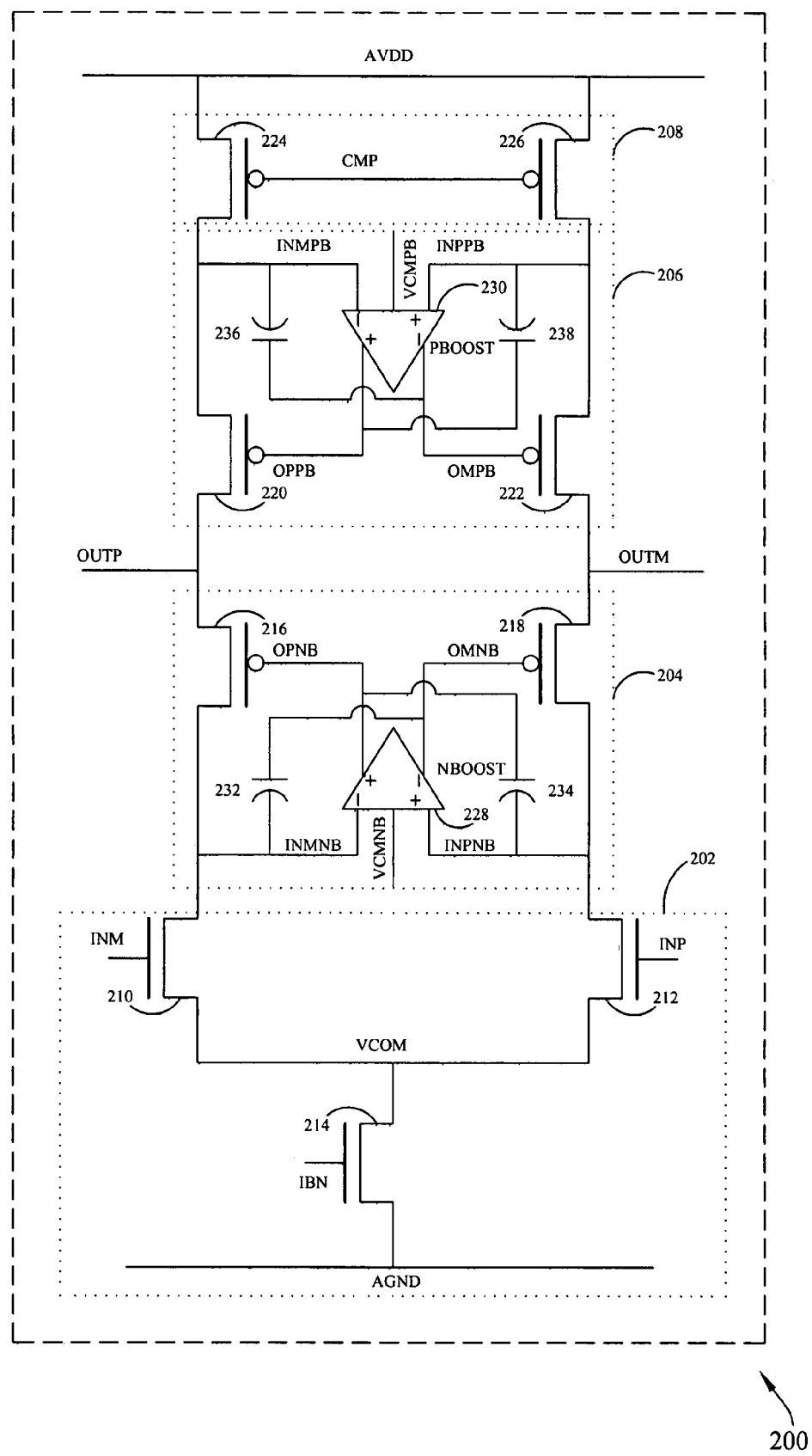
FIG. 2 illustrates a schematic diagram of a fully-differential gain-boosting technique according to an embodiment of the present invention.

FIG. 2 illustrates a schematic diagram of a fully-differential gain-boosting technique according to an embodiment of the present invention. In particular, an operational amplifier 200 is used for improving settling behavior. The operational amplifier 200 includes a first amplification stage 202, a second amplification stage 204, a third amplification stage 206 and a fourth amplification stage 208. The first amplification stage 202 is connected to a first input port (INM) and a second input port (INP).

The first amplification stage 202 includes a first transistor 210 connected to the first input port (INM), a second transistor 212 connected to the second input port (INP), and a third transistor 214 having a drain connected to source terminals of the first transistor 210 and the second transistor 212, a gate terminal connected to a third input port (IBN), and a source terminal connected to a ground voltage (AGND). The second amplification stage 204 is connected to the first amplification stage 202 through the first transistor 210 and the second transistor 212.

The second amplification stage 204 includes a first gain boosting stage 228 receiving a first signal (INMNB) and a second signal (INPNB), a fourth transistor 216 having a gate terminal connected to the first gain boosting stage 228, a source terminal connected to the first transistor 210 and a drain terminal connected to a first output port (OUTP), a fifth transistor 218 having a gate terminal connected to the first gain boosting stage 228, a source terminal connected to the second transistor 212, and a drain terminal connected to a second output port (OUTM), a first capacitor 232 and a second capacitor 234 connected with the first gain boosting stage 228.

The third amplification stage 206 is connected to the second amplification stage 204. The third amplification stage 206 includes a second gain boosting stage 230 receiving a third signal (INMPB) and a fourth signal (INPPB), a sixth transistor 220 having a gate terminal connected to the second gain boosting stage 230, a drain terminal connected to the fourth transistor 216 through the first output port (OUTP), and a source terminal connected to an input terminal of the second gain boosting stage 230, a seventh transistor 222 having a gate terminal connected to the second gain boosting stage 230, a drain terminal connected to the fifth transistor 218 through the second output port (OUTM), and a source terminal connected to the second gain boosting stage 230, a third capacitor 236 and a fourth capacitor 238 connected to the second gain boosting stage 230.

The fourth amplification stage 208 is connected to the third amplification stage 206. The fourth amplification stage 208 include an eighth transistor 224 having a source terminal connected to a supply terminal (AVDD), and a drain terminal connected to the third amplification stage 206, and a ninth transistor 226 having a gate connected to a gate terminal of the eighth transistor 224 for receiving a bias voltage (CMP), a source terminal connected to the supply terminal (AVDD), and a drain terminal connected to the third amplification stage 206. The transistors can be NMOS transistors and PMOS transistors.

In greater detail the drain terminals of the NMOS transistors M0, M1 of the amplification branch 102 are connected to the source terminals of the NMOS transistors 114A, 114B of amplification branches 104 and 106 respectively and the drain terminals of the transistors 114A, 114B are connected to the output terminals OUTP, OUTM. The drain terminals of PMOS transistors 114C, 114D of the amplification branches 108 and 110 and the source terminals of the transistors 114C, 114D are connected to the PMOS transistors M6, M7 of the amplification branch 112 and gate terminals of the transistors M6, M7 are connected together to a bias voltage VB3 and the source terminals are connected to a first supply terminal AVDD which supplies a higher supply voltage. The presence of compensation capacitors C0, C1, C2, and C3 substantially minimizes the effects due to pole-zero doublets resulting from a gain boosting.

A technique referred to as "capacitive neutralization" can be used to reduce a component of input capacitance of the op-amp due to the Miller effect, as described in Paul R. Gray, et al. "Neutralization", *Analysis and design of analog integrated circuits*, 4$^{th}$ ed., pp 849-850, which is incorporated herein by reference.

Considering the amplification branch 104, because of the symmetrical structure of the op-amp 100, the consideration that will be proposed may also be extended to the other amplification branches 106-110.

Present scheme attempts to reduce the capacitance at node 118, simultaneously do not help in fine tuning boosters with a capacitor at node 120. "*A New Modeling and Optimization of Gain-Boosting Amplifier for High-Speed and Low-Voltage Applications*", M. M. Ahmadi, *IEEE Transaction on circuits and systems II*, Volume 53, Issue 3, March 2006, Pages 169-173, which is incorporated herein by reference, has detailed gain expressions and the effect of node 118 capacitance on the open loop gain and shows clearly that a second order component of remainder has coefficient as node 118 capacitance.

The computation of the total capacitance at node 118 is done as following:

$C_{gs}$ is gate to source capacitance of transistor M2, $C_{gd}$ is gate to drain capacitance of transistor M0, $g_{m0}$ is a transconductance of the transistor M0, $r_9$ is an impedance at node 118, $A_b$ is booster amplifier (G0) gain and $C_0$ is a compensation capacitance of the compensation module C0 and $C_{ib}$ is capacitance at an input of booster.

Total capacitance at node 118 is composed of Miller capacitance of transistor M0$\approx[(C_{gd} \cdot g_{m0}*r_9)/(1+g_{m0}*r_9)]$.

Input capacitance of a booster amplifier G0$\approx C_{ib}$.

Miller capacitance from transistor M2 and the booster amplifier G0$\approx[(1+Ab)*Cgs]$.

Miller capacitance of the capacitance C0$\approx(1-Ab)*C0$ (Ab is the approximate gain between node 118 and 120).

$$\text{Total capacitance is given by} \approx [(C_{gd}*g_{m0}*r_9)/(1+g_{m0}*r_9)]+C_{ib}+(1+Ab)*C_{gs}+(1-Ab)*C0 \quad (1).$$

Equation 1 shows that the capacitance at node 118 can be reduced by changing the values of C0.

Figure 3:
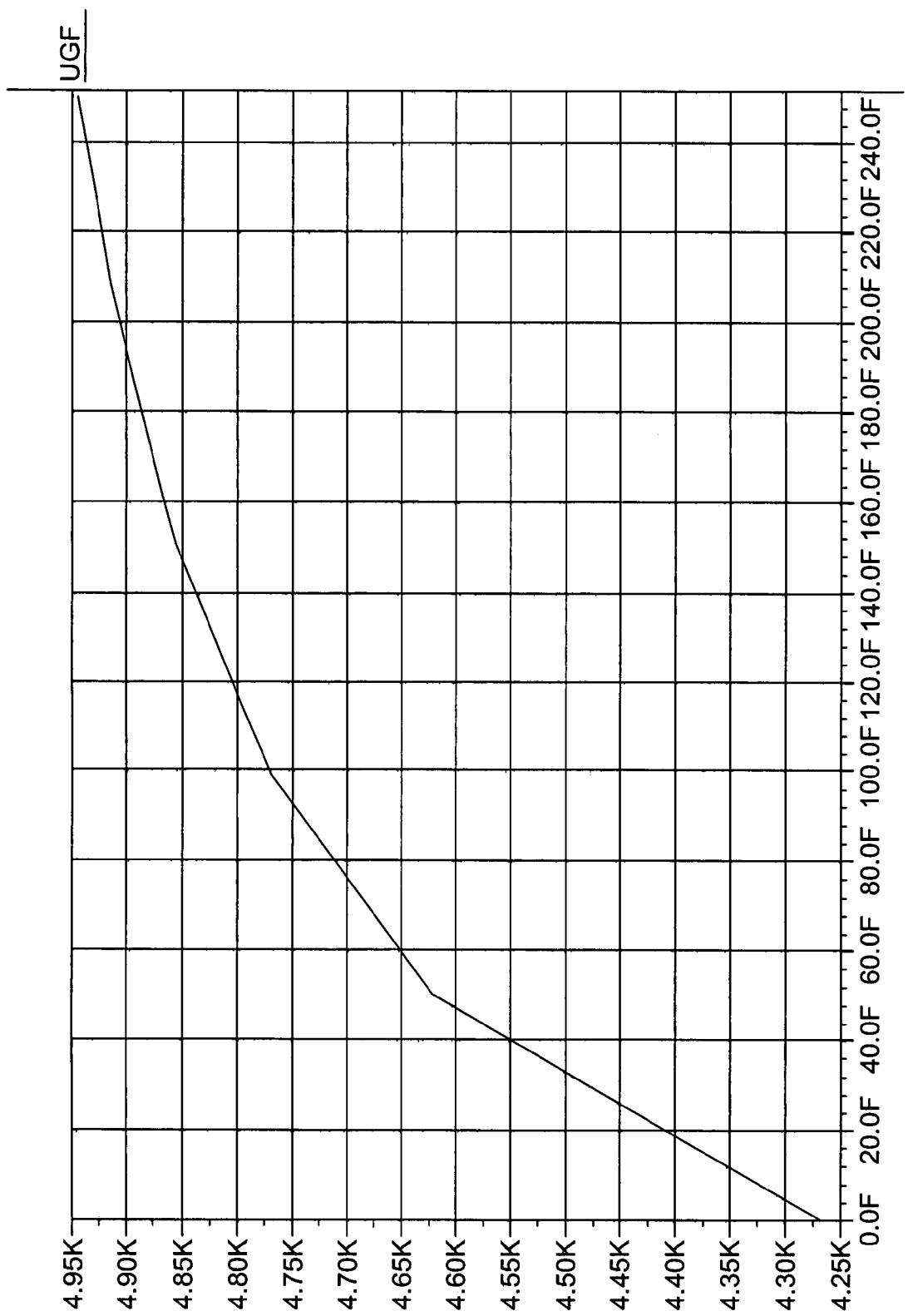
FIG. 3 illustrates a pole zero plot showing movement of doublets with different values of compensation capacitors.

This capacitance reduction will result in movement (out of application range) of non dominant poles associated with the capacitance of node 118 thus improvement in unity gain bandwidth which is clearly visible from FIG. 3. FIG. 3 shows the unity gain bandwidth of the op-amp as a function of compensation capacitor value.

Figure 4:
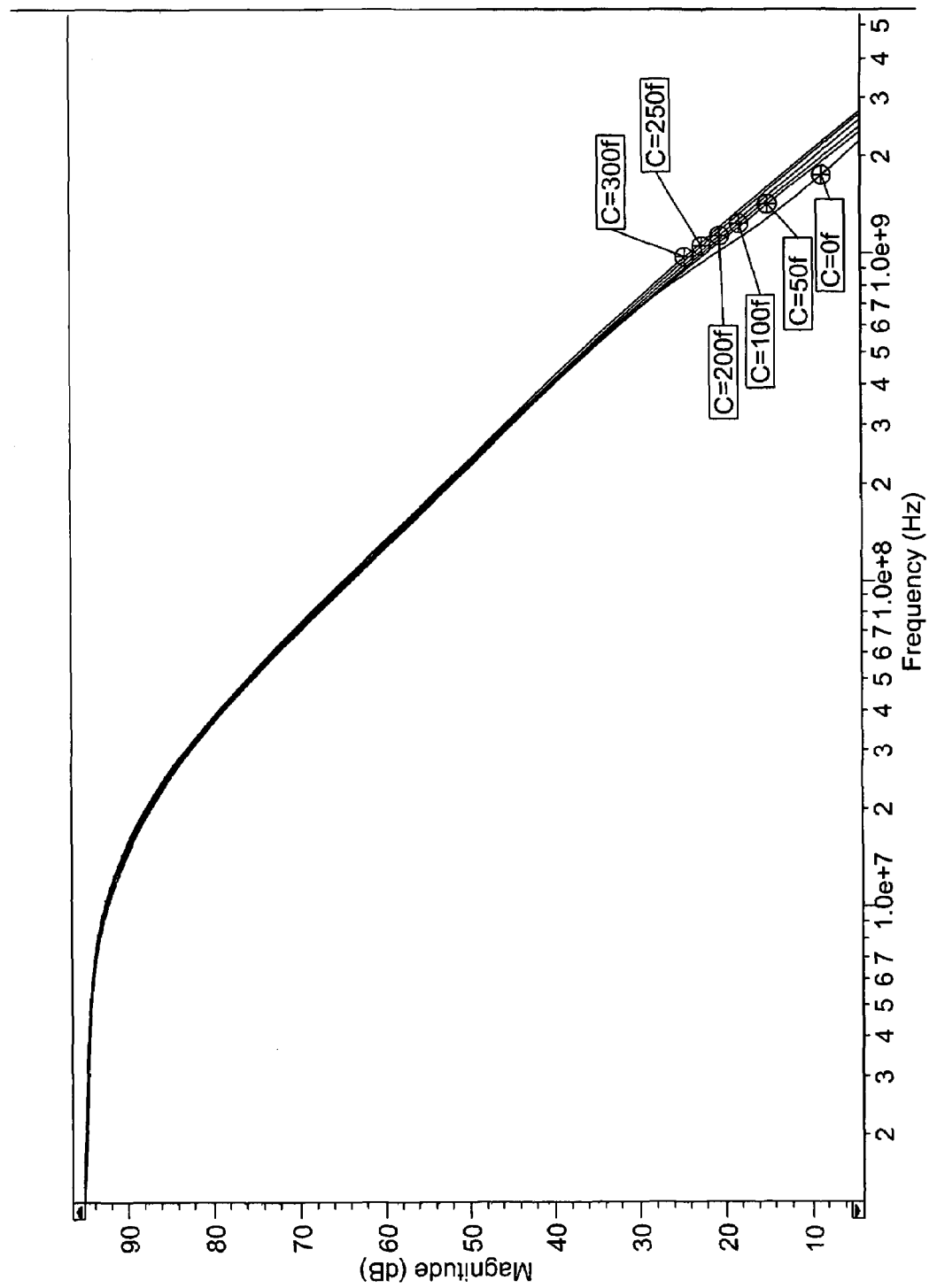
FIG. 4 illustrates an open loop gain Vs Frequency showing the improvement with embodiments of present invention.
Figure 5:
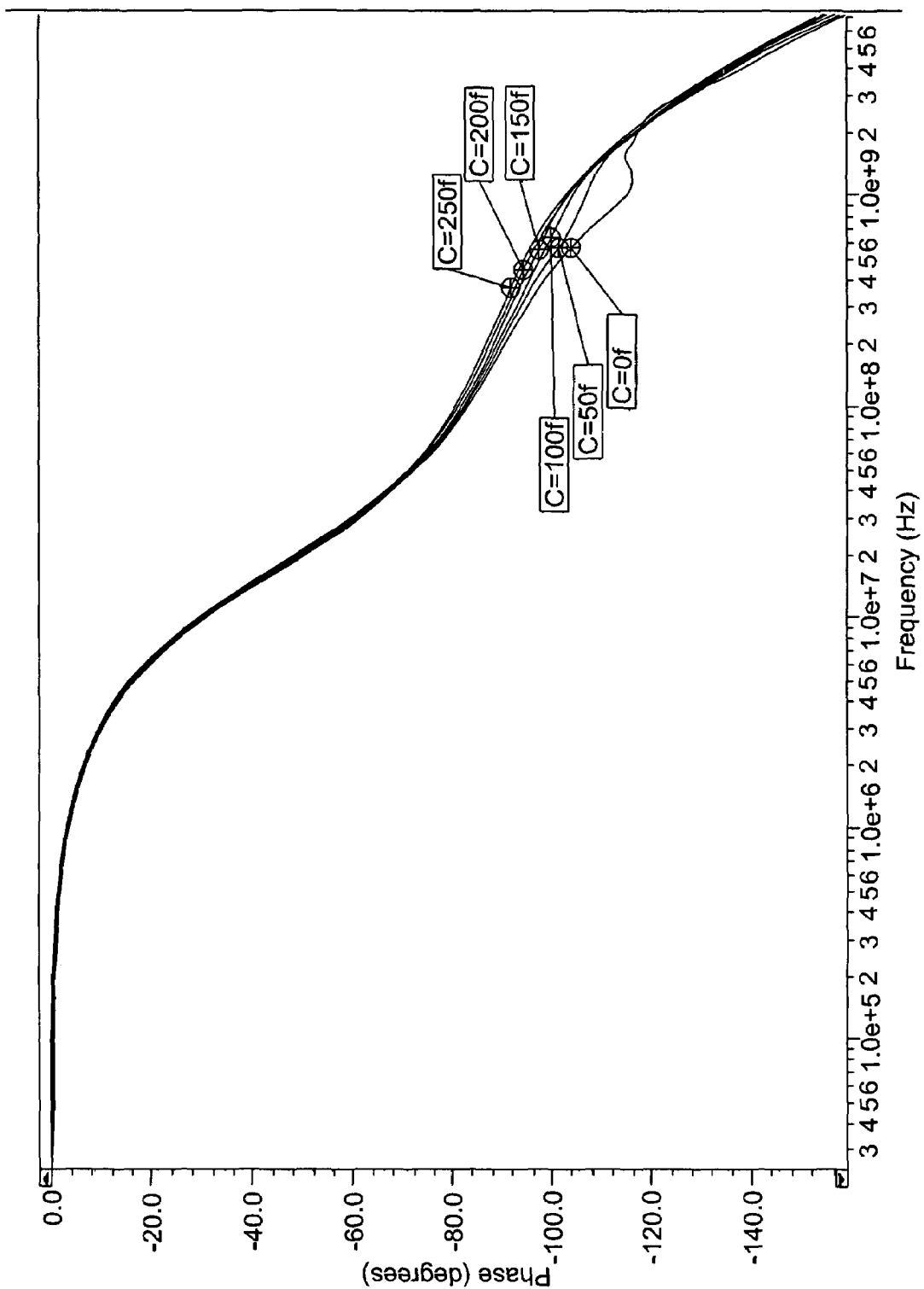
FIG. 5 illustrates Open loop Phase response Vs Frequency showing the improvement with embodiments of present invention.

Gain and phase plots (Bode diagrams) showed in FIG. 4 and FIG. 5 also show improvement. In general more uniform is gain and phase plots better is the settling behavior of the op-amp.

Figure 6:
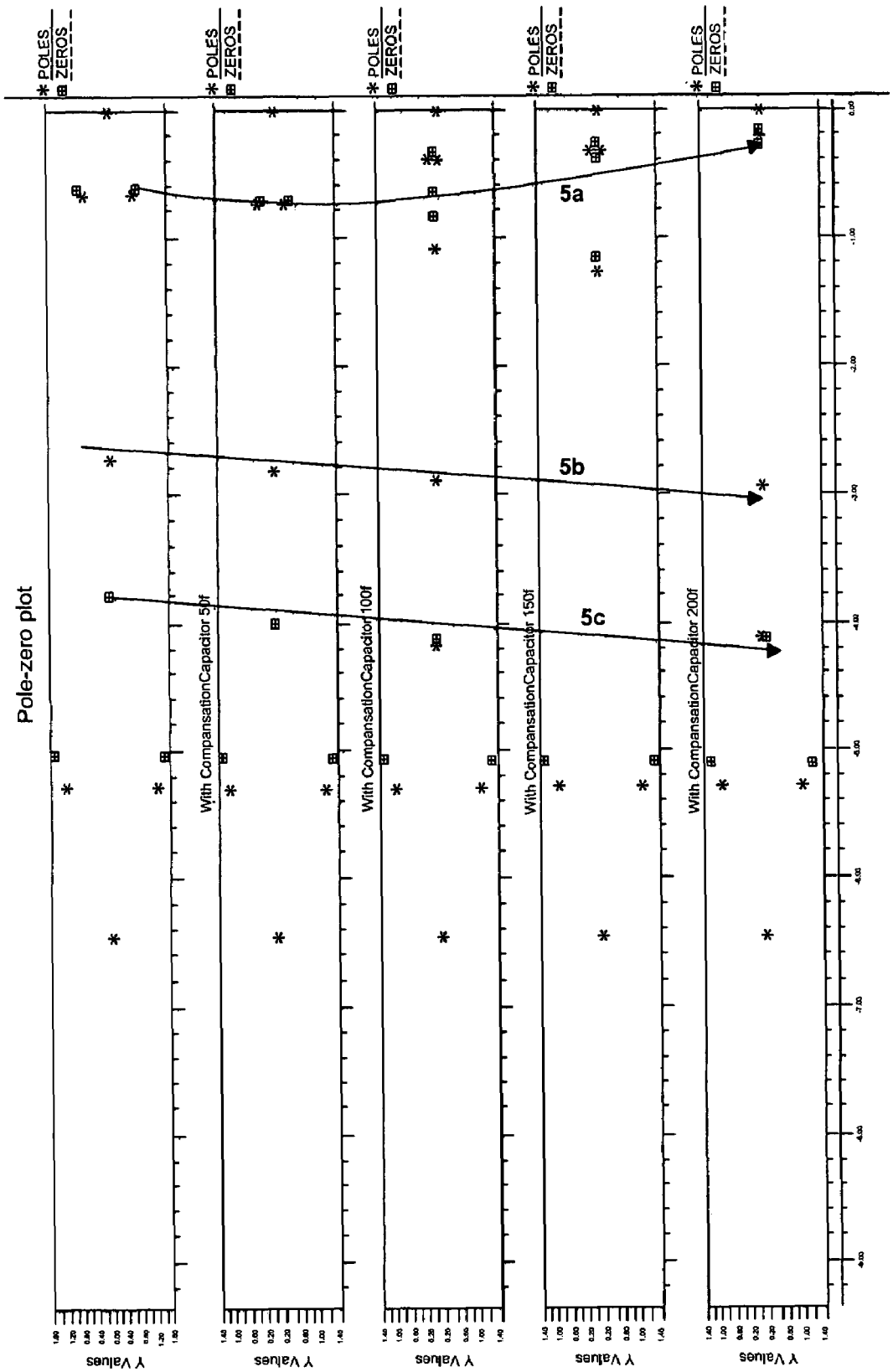
FIG. 6 illustrates a transient settling behavior comparison with embodiments of the present invention.
Figure 7:
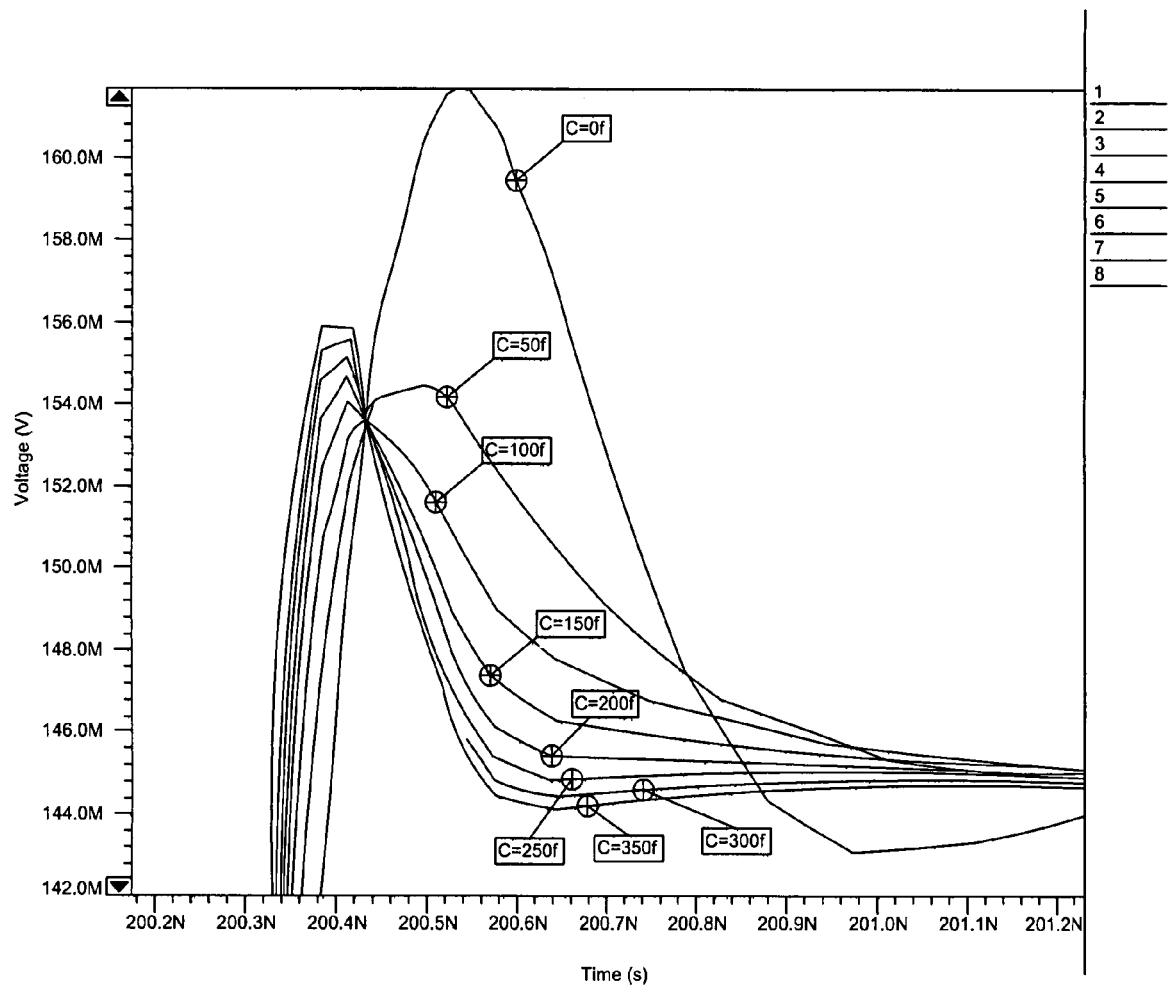
FIG. 7 illustrates a comparison plot for unity gain frequency Vs compensation capacitor value.

Pole zero plots shown in FIG. 6 show movement of non dominant poles as lines 5b and 5c and curve 5a shows the movement of doublet associated with the gate capacitance of the transistor 114A. FIG. 7 clearly shows the behavior of the output voltage with time and different values of the compensation capacitance.

Embodiments of the present invention therefore allow the use of gain boosting technique, avoiding the problems linked with the presence of pole-zero doublets in the bandwidth of operational amplifier 100.

Embodiments of the present invention offer various advantages. First, a first order settling behavior of an operational amplifier is achieved. Second, the novel circuit provides an improvement in the open loop bandwidth that makes settling faster. Thirdly, the novel circuit provides inherent booster compensation. Fourth the novel circuit provides immunity to small changes; because of process corners in capacitor values. Fifth, the novel circuit is an elegant compensation scheme with a wide range of application.

Operational amplifiers including CMFB modules according to embodiments of the present invention may be utilized in a variety of different types of electronic circuits and systems, such as portable devices like cell phones and personal digital assistants (PDAs), as well as in computer systems, communications and control systems, and so on.

From the foregoing it will be appreciated that, although specific embodiments of the invention have been described herein for purposes of illustration, various modifications may be made without deviating from the spirit and scope of the invention.

We claim:

1. An operational amplifier for improving settling behavior, comprising:
    a first amplification stage connected to a first input port and a second input port;
    a second amplification stage operatively coupled to said first amplification stage;
    a third amplification stage operatively coupled to said first amplification stage and said second amplification stage;
    a fourth amplification stage operatively coupled to said second amplification stage;
    a fifth amplification stage operatively coupled to said third amplification module and said fourth amplification stage;
    a sixth amplification stage operatively coupled to said fourth and fifth amplification stage; and
    wherein the second amplification stage comprises:
        a first gain boosting module receiving a bias voltage at a first input terminal;
        a fourth transistor having a gate terminal connected to an output of said first gain boosting module, a source terminal connected to a second input terminal of said first gain boosting module, and a drain terminal connected to a first output terminal; and
        a first compensation module operatively coupled to said fourth transistor and said first gain boosting module.

2. An operational amplifier for improving settling behavior, comprising:
    a first amplification stage connected to a first input port and a second input port;
    a second amplification stage operatively coupled to said first amplification stage;
    a third amplification stage operatively coupled to said first amplification stage and said second amplification stage;
    a fourth amplification stage operatively coupled to said second amplification stage;
    a fifth amplification stage operatively coupled to said third amplification module and said fourth amplification stage;
    a sixth amplification stage operatively coupled to said fourth and fifth amplification stage; and
    wherein the second amplification stage comprises:
        a first gain boosting module receiving a bias voltage at a first input terminal;
        a fourth transistor having a gate terminal connected to an output of said first gain boosting module, a source terminal connected to a second input terminal of said first gain boosting module, and a drain terminal connected to a first output terminal; and
        a first compensation module operatively coupled to said fourth transistor and said first gain boosting module;
    wherein the third amplification stage comprises:
        a second gain boosting module receiving a bias voltage at an input terminal;

a fifth transistor having a gate terminal connected to an output of said second gain boosting module, a source terminal connected to a second input of said second gain boosting module, and a drain terminal connected to a second output terminal; and a second compensation module having a first terminal coupled to said fifth transistor and said second gain boosting module, and having a second terminal connected to said fourth transistor of said second amplification stage.

3. The operational amplifier of claim 2, wherein the fourth amplification stage comprises:
   a third gain boosting module receiving a bias voltage at an input terminal;
   a sixth transistor having a gate terminal connected to an output of said third gain boosting module, a source terminal connected to a second input of said third gain boosting module, and a drain terminal connected to said first output terminal; and
   a third compensation module having a first terminal coupled to said sixth transistor and said third gain boosting module, and having a second terminal connected to a node.

4. The operational amplifier of claim 3, wherein the fifth amplification stage comprises:
   a fourth gain boosting module receiving a bias voltage at an input terminal;
   a seventh transistor having a gate terminal connected to an output of said fourth gain boosting module, a source terminal connected to a second input of said fourth gain boosting module, and a drain terminal connected to said second output terminal; and
   a fourth compensation module having a first terminal coupled to said seventh transistor and said fourth gain boosting module, and having a second terminal connected to said sixth transistor of said fourth amplification stage.

5. The operational amplifier of claim 4, wherein the sixth amplification stage comprises:
   an eighth transistor having its source terminal connected to a supply terminal, and its drain terminal connected to said fourth amplification stage; and
   a ninth transistor having its gate connected to a gate terminal of said eighth transistor for receiving a bias voltage, having its source terminal connected to said supply terminal, and its drain terminal connected to said fifth amplification stage.

6. The operational amplifier of claim 5, wherein the first amplification stage comprises:
   a first transistor connected to said first input port;
   a second transistor operatively coupled to said first transistor connected to said second input port; and
   a third transistor having its drain connected to source terminals of said first transistor and said second transistor, and a gate terminal connected to a third input port, its source terminal connected to a ground voltage.

7. The operational amplifier of claim 6, wherein said transistors comprise NMOS and PMOS transistors.

8. The operational amplifier of claim 6, wherein each of said compensation modules comprises a capacitor.

9. The operational amplifier of claim 6, wherein said boosting module and said compensation module are substantially matched.

10. An operational amplifier for improving settling behavior, comprising:
    a first amplification stage connected to a first input port and a second input port, comprising:
    a first transistor connected to the first input port;
    a second transistor connected to the second input port; and
    a third transistor having a drain connected to source terminals of said first transistor and said second transistor, a gate terminal connected to a third input port, and a source terminal connected to a ground voltage;
    a second amplification stage operatively coupled to the first amplification stage, comprising:
    a first gain boosting stage receiving a first signal and a second signal;
    a fourth transistor having a gate terminal connected to the first gain boosting stage, a source terminal connected to said first transistor, and a drain terminal connected to a first output port;
    a fifth transistor having a gate terminal connected to the first gain boosting stage, a source terminal connected to said second transistor, and a drain terminal connected to a second output port; and
    a first capacitor and a second capacitor operatively coupled with the first gain boosting stage;
    a third amplification stage operatively coupled to the second amplification stage, comprising:
    a second gain boosting stage receiving a third signal and a fourth signal;
    a sixth transistor having a gate terminal connected to the second gain boosting stage, a drain terminal connected to said fourth transistor through the first output port, and a source terminal connected to an input terminal of the second gain boosting stage;
    a seventh transistor having a gate terminal connected to the second gain boosting stage, a drain terminal connected to said fifth transistor through the second output port, and a source terminal connected to the second gain boosting stage; and
    a third capacitor and a fourth capacitor operatively coupled to the second gain boosting stage;
    a fourth amplification stage operatively coupled to the third amplification stage, comprising:
    an eighth transistor having a source terminal connected to a supply terminal, and a drain terminal connected to said third amplification stage; and
    a ninth transistor having a gate connected to a gate terminal of said eighth transistor for receiving a bias voltage, a source terminal connected to said supply terminal, and a drain terminal connected to said third amplification stage.

11. The operational amplifier of claim 10, wherein said transistors comprises NMOS transistors and PMOS transistors.

12. A method of providing an improved settling behavior through an operational amplifier, comprising:
    providing a first amplification stage including a first transistor having a gate coupled to receive a first input signal, a second transistor having a gate coupled to receive a second input signal, and a third transistor coupled to sources of the first and second transistors for receiving a first supply voltage;
    providing a second amplification stage including a first gain boosting module receiving a bias voltage at a first input terminal, a fourth transistor having a gate coupled to an output of said boost module, a source terminal connected to a second input terminal of said gain boosting module, and a drain terminal connected to a first output terminal, a first compensation module operatively coupled to said fourth transistor and said gain boosting module;

providing a third amplification stage including a second gain boosting module receiving the bias voltage at a first input terminal, a fifth transistor having a gate coupled to an output of said boosting module, a source terminal connected to a second input terminal of said gain boosting module, and a drain terminal connected to a second output terminal, a second compensation module operatively coupled to said fourth transistor and said second gain boosting module;

providing a fourth amplification stage including a third gain boosting module receiving a bias voltage at an input terminal, a sixth transistor having a gate coupled to an output of said third boosting module, a source terminal connected to a second input of said third gain boosting module, and a drain terminal connected to the first output terminal, a third compensation module operatively coupled to said sixth transistor and said third gain boosting module;

providing a fifth amplification stage including a fourth gain boosting module receiving a bias voltage at an input terminal, a seventh transistor having a gate coupled to an output of said fourth boosting module, a source terminal connected to a second input of said fourth gain boosting module, and a drain terminal connected to the second output terminal, a fourth compensation module operatively coupled to said sixth transistor and said fourth gain boosting module; and providing a sixth amplification stage operatively coupled to said fourth and fifth amplification stage including an eighth transistor having its source terminal connected to a supply terminal, and its drain terminal connected to said fourth amplification stage and a ninth transistor having its gate connected to a gate terminal of said eighth transistor for receiving a bias voltage, having its source terminal connected to said supply terminal, and its drain terminal connected to said fifth amplification stage.

* * * * *